(12) United States Patent
Ma et al.

(10) Patent No.: US 8,237,223 B2
(45) Date of Patent: Aug. 7, 2012

(54) SEMICONDUCTOR DEVICE

(75) Inventors: Shih-Kuei Ma, Hsinchu (TW); Ta-Chuan Kuo, Hsinchu (TW)

(73) Assignee: Episil Technologies Inc., Hsinchu (TW)

( * ) Notice: Subject to any disclaimer, the term of this patent is extended or adjusted under 35 U.S.C. 154(b) by 330 days.

(21) Appl. No.: 12/557,495

(22) Filed: Sep. 10, 2009

(65) Prior Publication Data
US 2011/0057262 A1    Mar. 10, 2011

(51) Int. Cl.
H01L 27/06    (2006.01)
(52) U.S. Cl. ........ 257/343; 257/355; 257/339; 257/372; 257/E27.016; 257/E27.033
(58) Field of Classification Search .................. 257/337, 257/339, 343, 345, 355, 373, 376, 398, 399, 257/401, 372, 494, 495, 546, E27.016, E27.033
See application file for complete search history.

(56) References Cited

U.S. PATENT DOCUMENTS

2006/0011974 A1 *   1/2006   Pendharkar .................. 257/334
2008/0173948 A1 *   7/2008   Ma et al. ...................... 257/371

* cited by examiner

*Primary Examiner* — Jerome Jackson, Jr.
*Assistant Examiner* — Yu Chen
(74) *Attorney, Agent, or Firm* — Jianq Chyun IP Office

(57) ABSTRACT

A semiconductor device including a substrate, an epitaxial layer, a first sinker, a transistor, a diode unit, a first buried layer, and a second buried layer is provided. When the semiconductor device is operated at the high voltage, the highly large substrate current due to the external load is avoided through the diode unit disposed in the semiconductor device of an embodiment consistent with the invention. Furthermore, according to the design of the semiconductor device, the issue of the narrow input voltage range is improved, and interference of the semiconductor device with the other semiconductor devices is prevented.

9 Claims, 3 Drawing Sheets

US 8,237,223 B2

SEMICONDUCTOR DEVICE

BACKGROUND OF THE INVENTION

1. Field of the Invention

The invention generally relates to a semiconductor device, and more particularly, to a semiconductor device capable of being operated at a high voltage without a large substrate current.

2. Description of Related Art

Semiconductor design has to be improved along with increasing integration and increasing complicated requirements thereof. For example, the design of high voltage devices must enable the high voltage devices to operate at a high voltage without effecting operation of other devices as well as large substrate currents.

FIG. 1 is a schematic view of a switch device formed by two high voltage n-type metal-oxide-semiconductors (HV-NMOS). Referring to FIG. 1A, the switch device 10 includes a high-side HV-NMOS 12 and a low-side HVNMOS 14, wherein a drain of the high-side HV-NMOS 12 is electrically connected to a system power Vcc, and a source of the high-side HV-NMOS 12 is electrically connected to an output pad Vo and a drain of the low-side HV-NMOS 14. However, when the switch device 10 is switched, the high-side HV-NMOS 12 is turned on. Meanwhile, a voltage level of the output pad Vo is affected by an external load, such as an external inductor, coupled thereto, so that overshoot occurs at the source of the high-side HV-NMOS 12. As a result, the voltage level of the source of the high-side HV-NMOS 12 is soon raised higher than the system power Vcc, so that a highly large substrate current is generated in the high-side HV-NMOS 12.

Accordingly, the high voltage device applied to the switch device may have a highly large substrate current while being operated at the high voltage. Moreover, the operation of any semiconductor device may possibly effect the operation of any others. It is thus desired to provide an improved solution addressing the above-mentioned issues.

SUMMARY OF THE INVENTION

One embodiment of the invention provides a semiconductor device capable of being operated at the high voltage without a highly large substrate current and preventing the semiconductor device from interfering with other semiconductor devices.

One embodiment of the invention provides a semiconductor device including a substrate, an epitaxial layer, a first sinker, a transistor, and a diode unit. The substrate has a first conductivity type. The epitaxial layer has a second conductivity type and disposed on the substrate. The first sinker has the second conductivity type, and is formed in the epitaxial layer. The first sinker has the second conductivity type and is disposed in the epitaxial layer. Furthermore, the first sinker extends from the substrate to an upper surface of the epitaxial layer and partitions the epitaxial layer into a first region and a second region. The transistor is disposed in the first region, wherein a drain of the transistor is electrically coupled to a first rail, and a source of the transistor is electrically coupled to a second rail. The diode unit is disposed in the second region and electrically coupled to the first sinker and the first rail.

In an embodiment of the present embodiment, the semiconductor device further includes a first buried layer and a second buried layer. The first buried layer has the first conductivity type and is disposed between the first region and the substrate. The second buried layer has the second conductivity type and is disposed between the first buried layer and the substrate and between the second region and the substrate, wherein the second buried layer disposed between the first buried layer and the substrate is connected with the first sinker.

In an embodiment of the present embodiment, the diode unit is further electrically coupled to the first sinker.

Accordingly, the highly large substrate current due to the external load is avoided through the diode unit disposed in the semiconductor device of an embodiment consistent with the invention when the semiconductor device is operated at the high voltage. Furthermore, according to the above-described design of the semiconductor device, the issue of the narrow input voltage range is improved, and interference of the semiconductor device with the other semiconductor devices is prevented.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 2:
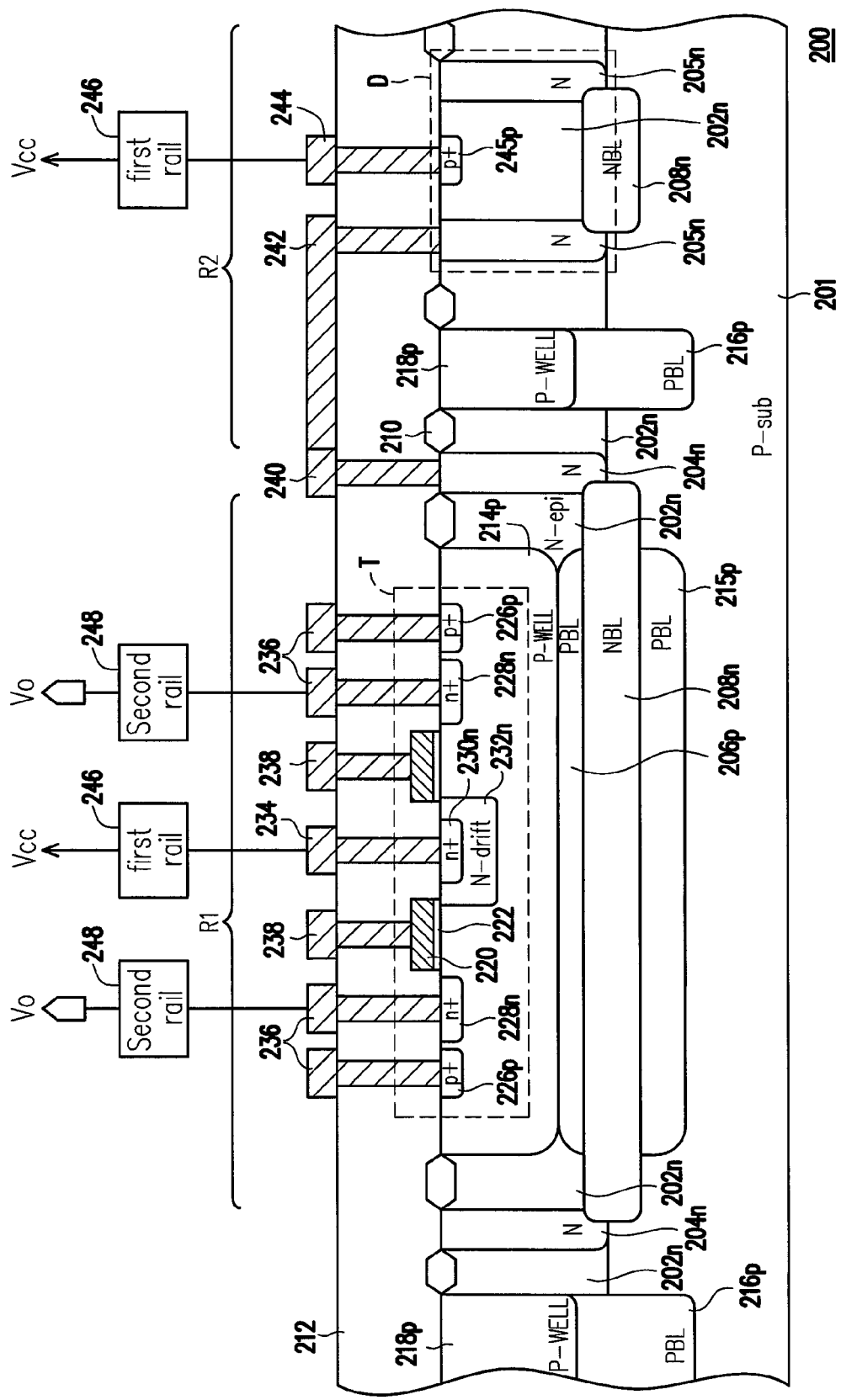
FIG. 2 is a cross-sectional view of a semiconductor device according to an embodiment consistent with the invention.

FIG. 2 is a cross-sectional view of a semiconductor device according to an embodiment consistent with the invention. Referring to FIG. 2, in the invention, the semiconductor device 200 includes a substrate 201, an epitaxial layer 202$n$, a first sinker 204$n$, a transistor T, a diode unit D, a first buried layer 206$p$ and a second buried layer 208$n$. Moreover, the semiconductor device 200 further includes an isolation structure 210, a dielectric layer 212, a well region 214$p$, a buried layer 216$p$, a well region 218$p$, interconnects 234, 236, 238, 240, 242, and 244, but the invention is not limited to the particular embodiment disclosed herein.

Figure 1:
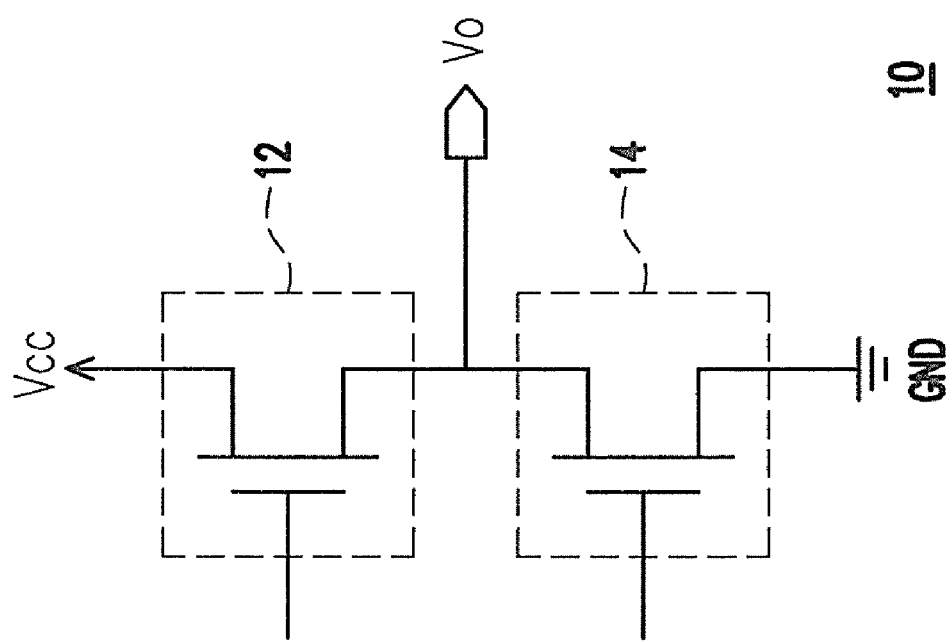
FIG. 1 is a schematic view of a switch device formed by two high voltage n-type metal-oxide-semiconductors (HV-NMOS).

In the present embodiment, the transistor T, for example, is a high voltage n-type metal-oxide-semiconductor (HV-NMOS), wherein a drain 230$n$ thereof is electrically connected to a first rail 246, and a source 228$n$ thereof is electrically connected to a second rail 248. Accordingly, when the semiconductor device 200 is applied to a switch device formed by two HV-NMOSs, the first rail 246 is electrically connected to a system power Vcc, and the second rail 248 is electrically connected to an output pad Vo. That is, the transistor T serves as the high-side HV-NMOS similar to that in FIG. 1A in the present embodiment. In other embodiments, the transistor T, for example, serves as the low-side HV-NMOS similar to that in FIG. 1A. On the contrary, the first rail 246 is electrically connected to the output pad Vo, and the second rail 248 is grounded.

In the present embodiment, the transistor T also includes a gate 220, a gate dielectric layer 222, and doped regions 226$p$,

228n, 230n and 232n. In addition, as shown in FIG. 2, the conductivity types of the above described components are represented by labels such as P-sub, N-epi, N, PBL, NBL, P-Well, n+, p+, N-drift and the like. This is for the ease of understanding by those skilled in the art, and should not be used to limit the invention. In other words, in other embodiments, the above described components can have opposite conductivity type. Furthermore, in the present embodiment, a first conductivity type is P-type, and a second conductivity type is N-type. In other embodiments, the first conductivity type is N-type, and the second conductivity type is P-type.

In the present embodiment, the diode unit D includes a doped region 245p, the second sinker 205n, and a part of the epitaxial layer 202n. As shown in FIG. 2, the conductivity types of the above described components are represented by labels such as p+, N, N-epi, and the like. This is for the ease of understanding by those skilled in the art, and should not be used to limit the invention. In the present embodiment, the second sinker 205n of the diode unit D is electrically connected to the first sinker 204n through the interconnects 240 and 242, and the doped region 245p is electrically connected to the first rail 246 through the interconnect 244.

Specifically, the substrate 201 has the first conductivity type. The epitaxial layer 202n has the second conductivity type and is formed on the substrate 201. The epitaxial layer 202n and substrate 201 cooperatively form a diode. During operation of the transistor T, rectifier function of the diode prevents the carrier from injecting into the substrate 201. The first sinker 204n has the second conductivity type. The first sinker 204n is formed in the epitaxial layer 202n and extends from the substrate 201 to an upper surface of the epitaxial layer 202n. The first sinker 204n partitions the epitaxial layer 202n into a first region R1 and a second region R2, wherein the well region 214 is located in the first region R1, and the diode unit D is located in the second region R2. In addition, the interconnect 240 is formed in the dielectric layer 212 and is electrically connected with the first sinker 204n.

The transistor T is located within the well region 214p. The doped region 226p of the transistor T has the first conductivity type, and the doped regions 228n, 230n and 232n have the second conductivity type, wherein the doped regions 228n, 230n and 232n respectively form a source, a drain, and a drift region of the transistor T. The doped regions 228n and 230n are located in the well region 214 at opposite sides of the gate 220 respectively, and the doped region 230n is located within the doped region 232n. Furthermore, the interconnects 234, 238, and 236 are formed in the dielectric layer 212 and electrically connected with the doped region 230n, the gate 220, and the doped regions 228n and 226p, respectively.

The diode unit D is located in the second region R2. The doped region 245p of the diode unit D is formed in epitaxial layer 202n and has the first conductivity type. The doped region 245p, for example, is a heavily doped region, wherein a doping concentration of the first buried layer 206p is larger than that of the epitaxial layer 202n in the present embodiment. Accordingly, the doped region 245p and the epitaxial layer 202n cooperatively form a diode. The second sinker 205n is formed in the epitaxial layer 202n and extends from the substrate 201 to the upper surface of the epitaxial layer 202n. In addition, the interconnect 242 is formed in the dielectric layer 212 and is electrically connected with the second sinker 205n.

In the present embodiment, the first buried layer 206p has the first conductivity type and is formed between the region R1 and the substrate 201. The first buried layer 206p is connected, for example, with the well region 214p. The second buried layer 208n having the second conductivity type is formed between the first buried layer 206p and the substrate 201 in the first region R1 and between the epitaxial layer 202n and the substrate 201 in the second region R2. The second buried layer 208n is connected with the first sinker 204n. The first buried layer 206p and the second buried layer 208n are, for example, heavily doped regions, wherein a doping concentration of the first buried layer 206p is, for example, larger than that of the substrate 201, and a doping concentration of the second buried layer 208n is, for example, larger than that of the epitaxial layer 202n. Due to the connection to the system power Vcc through the doped region 245p, the interconnect 244, and the first rail 246, the second sinker 205n, the interconnects 240 and 242, the first sinker 204n, and the second buried layer 208n become the highest voltage state from the floating state, thereby widening the allowable input voltage range.

In the present embodiment, if an input voltage is applied to the interconnect 234, the first buried layer 206p and the second buried layer 208n can reduce the parasitic bipolar effect in the vertical direction. In addition, if the interconnect 234 is applied with a high voltage, the voltage level of the interconnect 240 is, for example, lower than that of the interconnect 234 and higher than that of the interconnect 236. Therefore, the high voltage is directly applied to the interconnect 240 to thereby further prevent the breakdown from occurring at the interface between the epitaxial layer 202n and the substrate 201. Thus, the voltage applied to the interconnect 234 has a wider allowable range. Apparently, a voltage applied to the interconnect 236 may also have a wider allowable range. Thereby, the first sinker 204n, the first buried layer 206p, and the second buried layer 208n prevent the voltage applied to the transistor T from interfering with other semiconductor devices on the substrate 201. The sinker 204n, the first buried layer 206p and the second buried layer 208n can also prevent the transistor T from being interfered with other semiconductor devices on the substrate 201. Therefore, the transistor T does not cause latch-up of the other semiconductor devices.

In addition, the semiconductor device may include a third buried layer 215p of the first conductivity type. The third buried layer 215p is formed between the second buried layer 208n and the substrate 201. The third buried layer 215p, for example, is a heavily doped region with a doping concentration being larger than that of the substrate 201. In fabricating the semiconductor device, the third buried layer 215 and the first buried layer 206p, for example, are formed at the same time.

Moreover, when the semiconductor device 200 is applied to the switch device formed by two HV-NMOSs, the first rail 246 is electrically connected to the system power Vcc, and the second rail 248 is electrically connected to the output pad Vo. That is, the transistor T serves as the high-side HV-NMOS similar to that in FIG. 1A. When the switch device is switched, the transistor T is turned on. Meanwhile, a voltage level of the output pad Vo is affected by an external load, such as an external inductor, coupled thereto, so that overshoot occurs at the source 228n of the transistor T. That is, the voltage level of the source 228n of the transistor T is soon raised higher than the system power Vcc. In the present embodiment, the second sinker 205n and the doped region 245p of the diode unit D are respectively electrically connected with the first sinker 204n and the first rail 246. Accordingly, when the voltage level of the source 228n of the transistor T is raised higher than the system power Vcc, the too large substrate current is not generated in the transistor T because the voltage levels of the first sinker 204n, the second sinker 205n, and the second buried layer 208n are all raised to be higher than the system power Vcc. Meanwhile, for the same reason why the too large substrate current is not generated in the transistor T, the diode cooperatively formed by the well region 214p, the second buried layer 208n, and the substrate 201 and the diode cooperatively formed by the well region 214p, the epitaxial layer 202n, and the first buried layer 204n are both reversely biased, so that they are not broken down. Therefore, the semiconductor device 200 is capable of being applied to the switch device formed by high voltage devices without a highly large substrate current.

In another aspect, the semiconductor device 200 may also include a junction isolation structure of the first conductivity type. The junction isolation structure isolates the semiconductor device 200 from other semiconductor devices on the substrate 201. In this embodiment, the junction isolation structure, for example, consists of another buried layer 216p and another well region 218p. The buried layer 216p extends from the substrate 201 to the epitaxial layer 202n, and the well region 218p extends from the buried layer 216p to the upper surface of the epitaxial layer 202n. In fabricating the semiconductor device 200, the buried layer 216p and the first buried layer 206p, for example, are formed at the same time, and the well region 218p and the well region 214p, for example, are formed at the same time.

Figure 3:
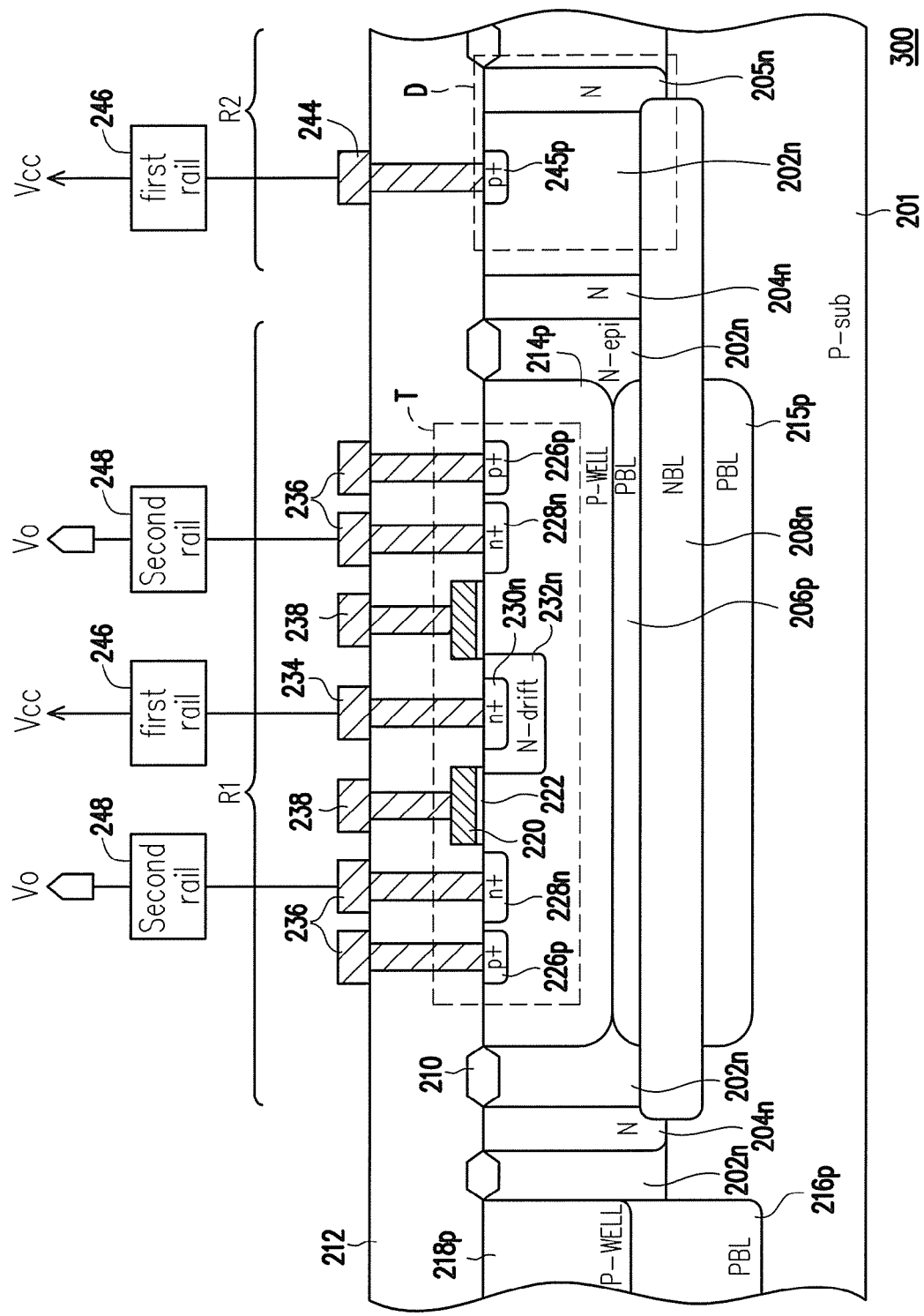
FIG. 3 is a cross-sectional view of a semiconductor device according to another embodiment consistent with the invention.

FIG. 3 is a cross-sectional view of a semiconductor device according to another embodiment consistent with the invention. For the sake of simplicity, only the differences between the second and first embodiments are described herein. Referring to FIG. 3, the semiconductor device 300 of the present embodiment is similar to that of the above-described present embodiment (as shown in FIG. 2), and the difference between the two semiconductor device 300 and 200 is described as follows.

In the present embodiment, a region of the semiconductor device 300 does not include the junction isolation structure consisting of the buried layer 216p and the well region 218p in the second region R2. That is, in the process of fabricating the semiconductor device 300, the junction isolation structure consisting of the buried layer 216p and the well region 218p as shown in FIG. 2 is not formed, and the second buried layer 208n extends from the first region R1 to the second region R2. Moreover, the diode unit D does not include the left second sinker 205n of the second region R2 in the present embodiment.

To sum up, in the above-described embodiments consistent with the invention, the undesirable substrate current is avoided through the disposed diode unit when the semiconductor device is operation at the high voltage. Furthermore, the epitaxial layer and the substrate have opposite conductivity types, so as to provide a diode rectifier function, thereby preventing excessive carrier from injecting into the substrate. In addition, between the epitaxial layer and the substrate are provided with two buried layers. With the provision of the buried layers, the structure of the parasitic diode or parasitic transistor can be changed. Moreover, since the buried layers are provided, adjusting voltage of the buried layers can prevent the input voltage applied to the semiconductor device from being totally applied to the substrate. This can widen the operation voltage range of the high voltage device. In addition, the above mentioned structure can effectively prevent latch-up. The above mentioned structure will be described in detail by the following first and second embodiments.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A semiconductor device comprising:
    a substrate having a first conductivity type;
    an epitaxial layer having a second conductivity type and disposed on the substrate;
    a first sinker having the second conductivity type, disposed in the epitaxial layer, extending from the substrate to an upper surface of the epitaxial layer, connected with a first interconnect, and partitioning the epitaxial layer into a first region and a second region;
    a transistor disposed in the first region, wherein a drain of the transistor is electrically coupled to a first rail, and a source of the transistor is electrically coupled to a second rail; and
    a diode unit disposed in the second region and electrically coupled to the first rail, wherein the diode unit comprising:
        a doped region having the first conductivity type, disposed in the epitaxial layer, connected with a second interconnect, and electrically coupled to the first rail; and
        a second sinker having the second conductivity type, connected with a third interconnect, and extending from the substrate to the upper surface of the epitaxial layer,
    wherein the substrate is connected with the second sinker, and the diode unit is electrically coupled to the first sinker through the second sinker, a voltage level of the second interconnect is higher than voltage levels of the first and the third interconnects, and the first and the third interconnects are connected with each other.

2. The semiconductor device as claimed in claim 1, further comprising:
    a first buried layer having the first conductivity type and disposed between the first region and the substrate; and
    a second buried layer having the second conductivity type and disposed between the first buried layer and the substrate and between the second region and the substrate, wherein the second buried layer disposed between the first buried layer and the substrate is connected with the first sinker.

3. The semiconductor device as claimed in claim 2, further comprising a third buried layer having the first conductivity type, wherein the third buried layer is disposed below the first buried layer and between the second buried layer and the substrate.

4. The semiconductor device as claimed in claim 3, wherein a doping concentration of the third buried layer is greater than that of the substrate.

5. The semiconductor device as claimed in claim 2, wherein a doping concentration of the first buried layer is greater than that of the substrate.

6. The semiconductor device as claimed in claim 1, wherein the first rail is electrically coupled to a system power, and the second rail is electrically coupled to an output pad.

7. The semiconductor device as claimed in claim 1, wherein the transistor is a high voltage metal-oxide-semiconductor field effect transistor.

8. The semiconductor device as claimed in claim 1, wherein the first conductivity type is P-type, and the second conductivity type is N-type.

9. The semiconductor device as claimed in claim 1, wherein the first conductivity type is N-type, and the second conductivity type is P-type.

* * * * *